(12) United States Patent
BrightSky et al.

(10) Patent No.: US 9,240,324 B2
(45) Date of Patent: Jan. 19, 2016

(54) SELF-ALIGNED PROCESS TO FABRICATE A MEMORY CELL ARRAY WITH A SURROUNDING-GATE ACCESS TRANSISTOR

(71) Applicant: GLOBALFOUNDRIES Inc., Grand Cayman (KY)

(72) Inventors: Matthew J. BrightSky, Essex Junction, VT (US); Chung H. Lam, Peekskill, NY (US); Gen P. Lauer, Mahopac, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/328,921

(22) Filed: Jul. 11, 2014

(65) Prior Publication Data
US 2014/0322907 A1    Oct. 30, 2014

Related U.S. Application Data

(62) Division of application No. 13/451,902, filed on Apr. 20, 2012, now Pat. No. 8,835,898.

(51) Int. Cl.
*H01L 21/28* (2006.01)
*H01L 27/24* (2006.01)
*H01L 45/00* (2006.01)

(52) U.S. Cl.
CPC ...... *H01L 21/28008* (2013.01); *H01L 27/2454* (2013.01); *H01L 27/2463* (2013.01); *H01L 45/06* (2013.01); *H01L 45/1233* (2013.01); *H01L 45/143* (2013.01); *H01L 45/144* (2013.01)

(58) Field of Classification Search
None
See application file for complete search history.

(56) References Cited

U.S. PATENT DOCUMENTS

| 5,055,898 | A  | 10/1991 | Beilstein et al. | 257/301 |
|---|---|---|---|---|
| 7,459,716 | B2 | 12/2008 | Toda et al. | 257/2 |
| 7,586,149 | B2 | 9/2009 | Yoon et al. | 257/329 |
| 7,834,337 | B2 | 11/2010 | Takaura et al. | 257/2 |
| 7,852,658 | B2 | 12/2010 | Liu et al. | 365/148 |
| 2001/0053089 | A1* | 12/2001 | Noble | G11C 11/412 365/154 |
| 2004/0233748 | A1 | 11/2004 | Terao et al. | 365/202 |
| 2006/0237756 | A1* | 10/2006 | Park | H01L 27/2409 257/296 |
| 2006/0273298 | A1 | 12/2006 | Petti | 257/5 |
| 2008/0149910 | A1* | 6/2008 | An | G11C 11/5678 257/4 |
| 2009/0001336 | A1* | 1/2009 | Habib | G01K 7/16 257/2 |

(Continued)

*Primary Examiner* — Anthony Ho
*Assistant Examiner* — Samuel Lair
(74) *Attorney, Agent, or Firm* — Heslin Rothenberg Farley & Mesiti P.C.

(57) ABSTRACT

A method to prevent a gate contact from electrically connecting to a source contact for a plurality of memory cells on a substrate. The method includes depositing and etching gate material to partially fill a space between the pillars and to form a word line for the memory cells, etching a gate contact region for the word line between the pair of pillars, forming a spacer of electrically insulating material in the gate contact region, and depositing a gate contact between the pair of pillars to be in electrical contact with the gate material such that the spacer surrounds the gate contact.

10 Claims, 6 Drawing Sheets

(56) References Cited

U.S. PATENT DOCUMENTS

| | | | |
|---|---|---|---|
| 2009/0017629 A1 | 1/2009 | Jang | 438/700 |
| 2009/0091037 A1 | 4/2009 | Assefa et al. | 257/773 |
| 2009/0224294 A1 | 9/2009 | Fujimoto | 257/288 |
| 2010/0133497 A1 | 6/2010 | Fujimoto | 257/2 |
| 2010/0224924 A1 | 9/2010 | Ellis et al. | 257/300 |
| 2011/0006360 A1 | 1/2011 | Ikebuchi | 257/329 |
| 2011/0305074 A1 | 12/2011 | Lung et al. | 365/163 |
| 2012/0068136 A1* | 3/2012 | Park | H01L 45/06 257/1 |
| 2013/0200330 A1* | 8/2013 | BrightSky | H01L 45/06 257/5 |
| 2014/0024185 A1* | 1/2014 | BrightSky | H01L 27/101 438/268 |
| 2015/0214313 A1* | 7/2015 | Oh | H01L 29/4236 257/2 |

* cited by examiner

SELF-ALIGNED PROCESS TO FABRICATE A MEMORY CELL ARRAY WITH A SURROUNDING-GATE ACCESS TRANSISTOR

CROSS-REFERENCE TO RELATED APPLICATIONS

This application is a divisional of and claims priority under 35 U.S.C. §120 to U.S. patent application Ser. No. 13/451,902 ("SELF-ALIGNED PROCESS TO FABRICATE A MEMORY CELL ARRAY WITH A SURROUNDING-GATE ACCESS TRANSISTOR") filed Apr. 20, 2012.

BACKGROUND

This invention relates to arrays of memory cells. Modern manufacturing techniques make it possible to pack more memory cells on a given area of substrate. Newer types of memory, such as Phase Change Memory cells, need a large amount of current to operate. This in turn has given rise to transistors, such as vertical access transistors, that allow for a large amount of current to be delivered to a relatively small area.

The confluence of high current densities and memory cells packed into relatively small areas has resulted in configurations and methods of manufacture that can accommodate them. One development has been the use of a self-alignment fabrication technique that allows structure to be formed on the substrate without photo resist masking. This allows for a tighter packing of cells than otherwise possible using traditional lithography techniques. However, such tightly packed memory arrays are susceptible to unintentional electrical shorting between the common-source contact and the word-line contact, thus rendering the memory array nonfunctional.

BRIEF SUMMARY

Accordingly, one example aspect of the present invention is a method to prevent a word-line contact from electrically connecting to a source contact for a plurality of memory cells on a substrate. The method includes formation of dieletric pillars on a substrate, depositing an electrically conductive gate material between and over the dielectric pillars, etching the gate material such that the gate material partially fills a space between the pillars and the gate material forms a word line for the memory cells, etching a gate contact region for the word line between a pair of the pillars, forming a spacer of electrically insulating material in the gate contact region and depositing a gate contact between the pair of pillars such that the gate contact is in electrical contact with the gate material and the spacer surrounds the gate contact.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
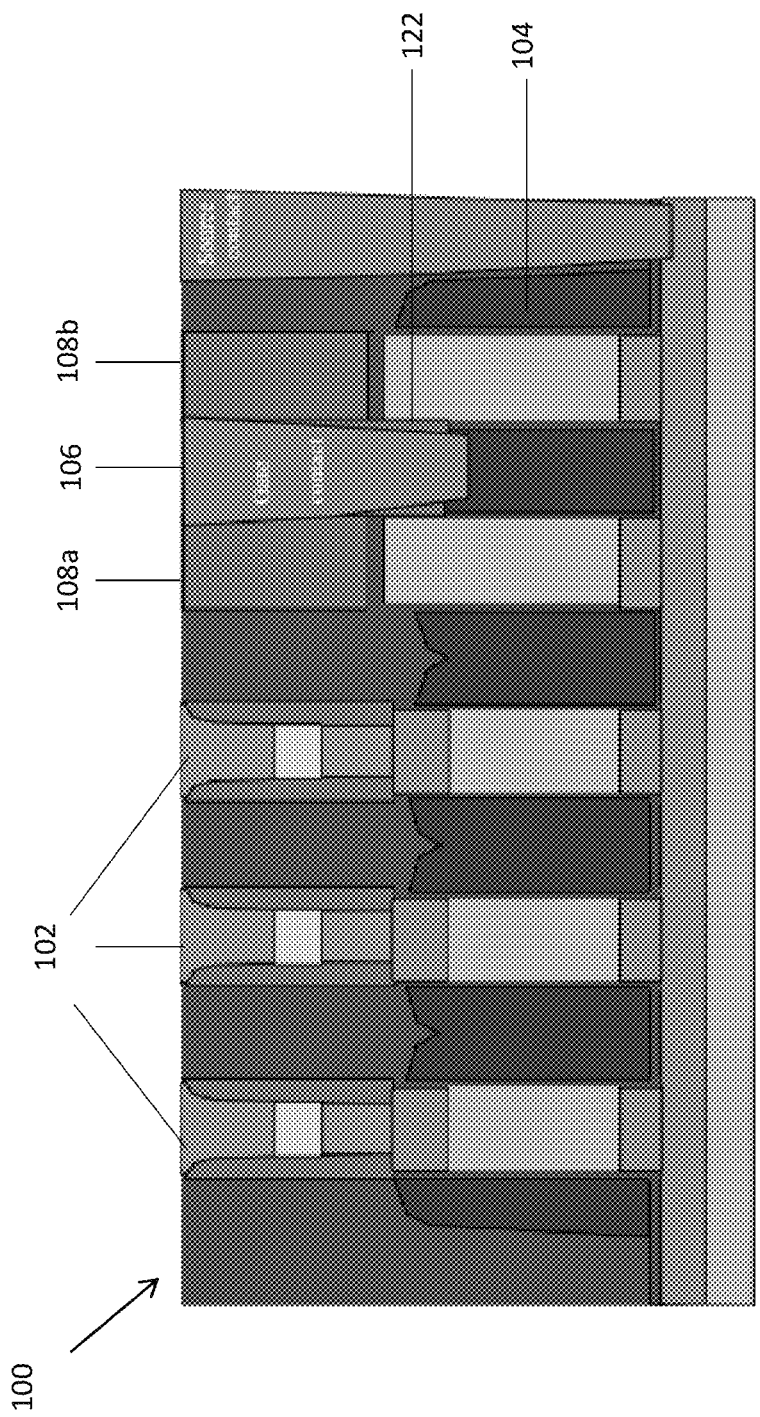
FIG. 1 shows a memory array in accordance with one embodiment of the present invention. The figure is a cutaway view along a word line, showing a plurality of memory cells, a word-line contact, a source contact and a spacer of electrically insulating material surrounding a gate contact, with the spacer disposed between the gate contact and a pair of dielectric pillars.

The present invention is described with reference to embodiments of the invention. Throughout the description of the invention reference is made to FIGS. 1-6. When referring to the figures, like structures and elements shown throughout are indicated with like reference numerals.

FIG. 1 shows a memory array in accordance with one embodiment of the present invention. In this embodiment, a memory array 100 has a plurality of memory cells 102 and a word line 104 electrically coupled to the plurality of memory cells 102 and a word-line contact 106. Further, a pair of dielectric pillars 108a and 108b is positioned parallel to the word line 104. A spacer made of electrically insulating material 122 surrounds a gate contact 106. The spacer 122 is disposed between the gate contact 106 and the pair of pillars 108a and 108b. The electrically insulating material may be silicon nitride.

Figure 2:
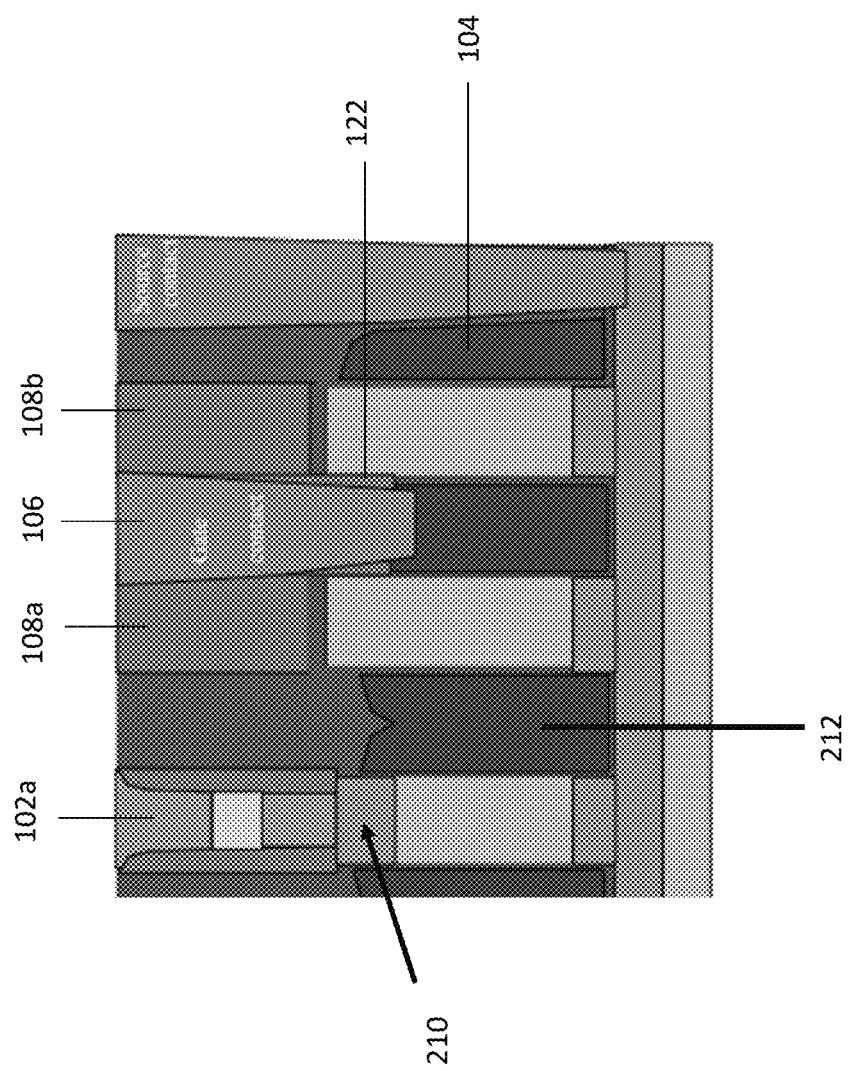
FIG. 2 is a magnified view of the pair of dielectric pillars around a gate contact and an electrical coupling between one of the plurality of memory cells to the word-line contact.

FIG. 2 is a closer view of the pair of pillars around the gate contact and the electrical coupling of a memory cell to the word-line contact in one embodiment of the present invention. A first pillar 108a of the pair of dielectric pillars 108a and 108b is disposed on a first side 106a of the word-line contact 106 and a second pillar 108b of the pair of pillars 108a and 108b is disposed on a second side 106b of the gate contact 106. The spacer 122 surrounds the gate contact 106 and is disposed between the first pillar 108a and the gate contact 106 on one side of the gate contact 106, and between the second pillar 108b and the gate contact 106 on the other side of the gate contact 106. Referring to FIG. 1 and FIG. 2, a memory cell 102a of the plurality of memory cells 102 may include a vertical access transistor 210. Each vertical access transistor 210 includes a gate terminal 212 electrically coupled to the word-line contact 106. In one embodiment of the invention, the memory cells 102 are phase change memory cells. The phase change memory cells may include $Ge_2Sb_2Te_5$. Alternatively, the phase change memory cells may include $Sb_xTe_{1-x}$, material, where $0.4 (Sb_2Te_3) <= x <= 0.7 (Sb_7Te_3)$. In another embodiment, the phase change memory cells may include $In_2Se_3$. The vertical access transistor may be a vertical surrounding-gate transistor with a channel diameter of one lithographic size feature.

Figure 3:
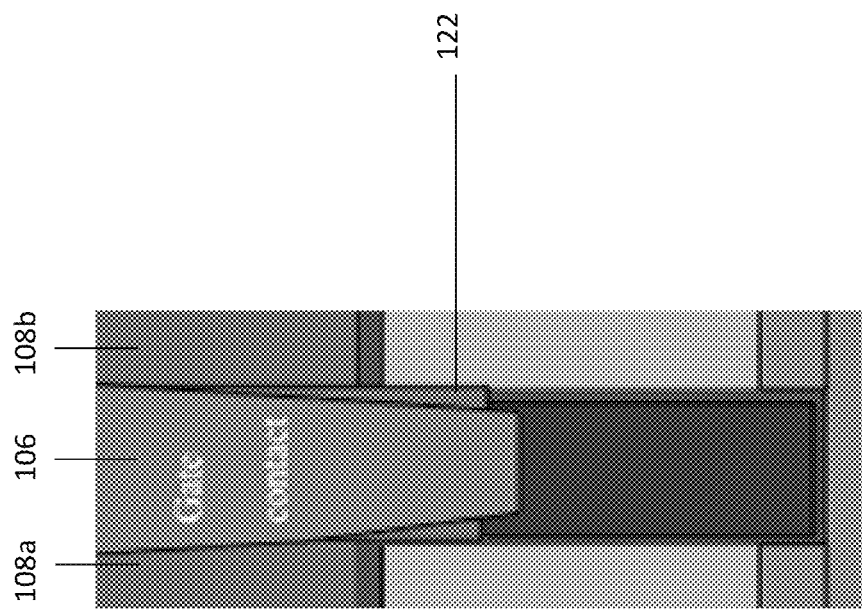
FIG. 3 is a close-up view of the gate contact and the spacer.

FIG. 3 is a close-up view showing the gate contact 106, the pair of pillars 108a and 108b, and the spacer made of electrically insulating material 122.

Figure 4:
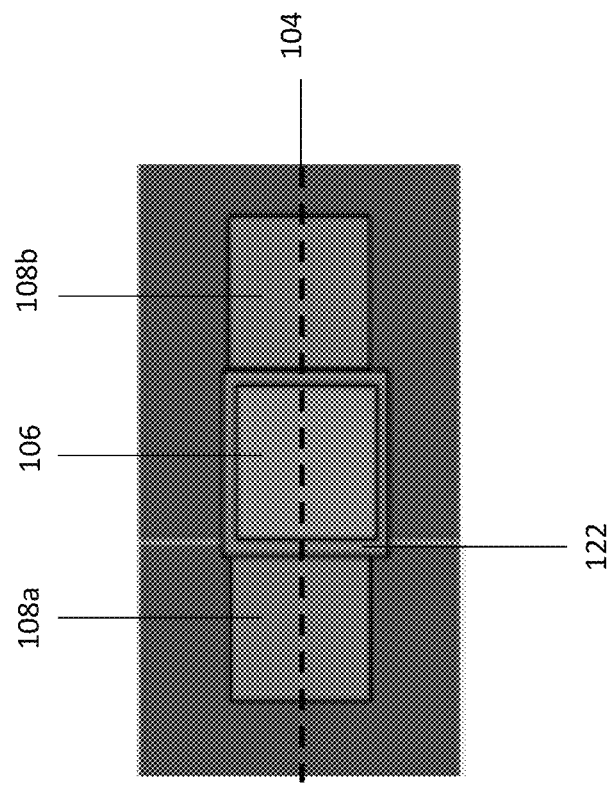
FIG. 4 is an elevation view of the same region as in FIG. 2.

FIG. 4 is an elevation view of FIG. 3 showing the word line 104, the gate contact 106, the pair of dielectric pillars 108a and 108b and the spacer made of electrically insulating material 122.

Figure 5:
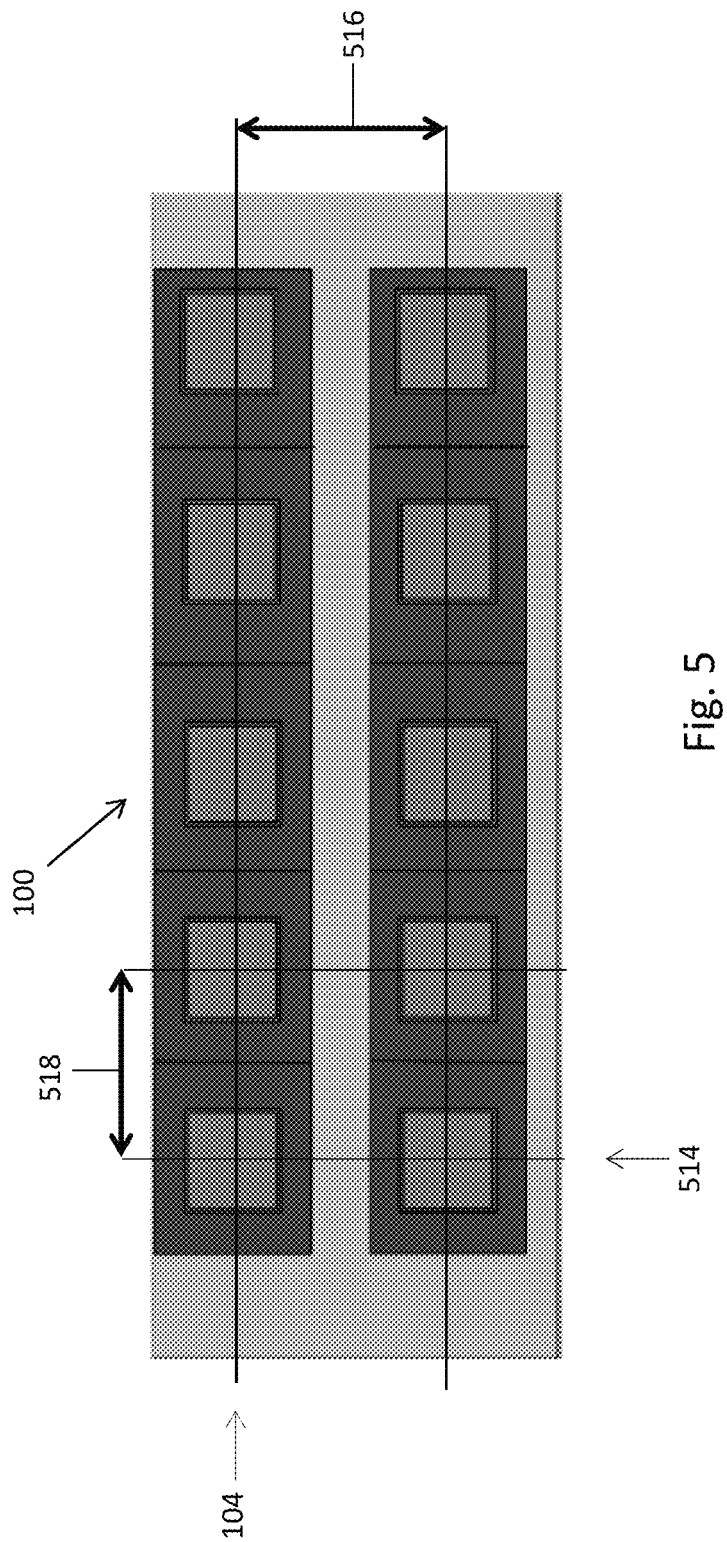
FIG. 5 is an elevation view of the memory array before the gate contact is deposited. This view illustrates relative linear dimensions of word and bit lines.

FIG. 5 is a schematic drawing of an elevation view of one embodiment of the present invention, showing the memory array 100 before the gate contact 106 (see FIG. 3) is deposited. The memory array 100 includes a plurality of bit lines 514. Referring to FIG. 1, each of the bit lines 514 is electrically coupled to one of the memory cells 102 along the word line 104. The bit lines 514 have a bit line pitch 518 and the word lines 104 have a word line pitch 516. The bit line pitch and word line pitch are designed in a way that the space between neighboring pillars in word line direction is smaller than that in bit line direction. Thus, the neighboring word lines are well separated. The bit line pitch 518 of the bit line 514 may be one lithographic feature size less than the word line pitch 516 of the word line 504. In another embodiment of the present invention, each of the bit lines 514 has a bit line pitch 518 of two lithographic feature sizes, and each word line 104 has a word line pitch 516 of three lithographic feature sizes.

Figure 6:
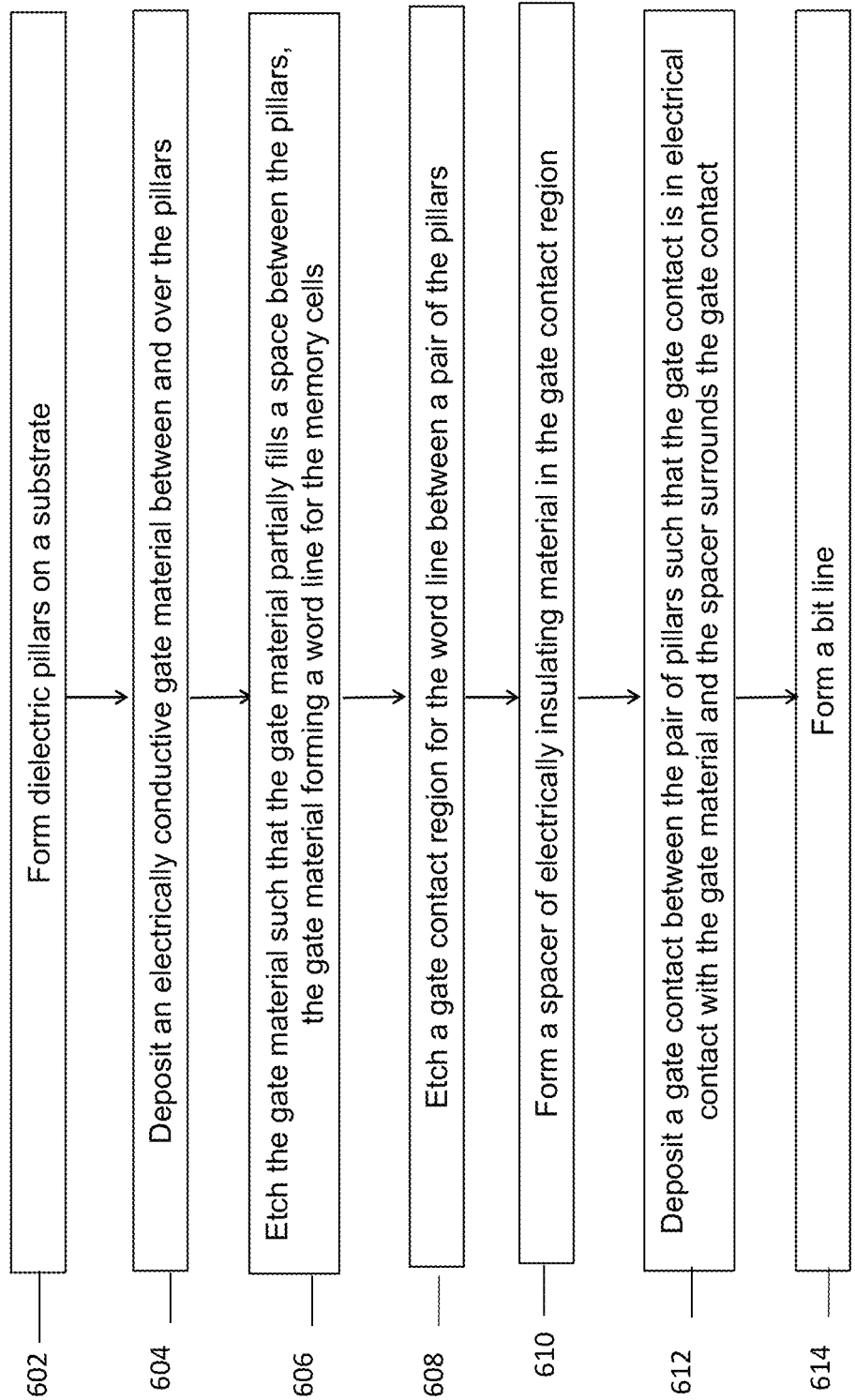
FIG. 6 shows a method to prevent a word-line contact from electrically connecting to a source contact for a plurality of memory cells on a substrate, in accordance with one embodiment of the present invention.

FIG. 6 shows a method to prevent a word-line contact from electrically connecting to a source contact for a plurality of memory cells on a substrate, in accordance with one embodiment of the present invention. The memory cells may be any types of memory cells that require access transistors. In one embodiment, the memory cells may be phase change memory cells. As discussed above, the phase change memory cells may include $Ge_2Sb_2Te_5$, a $Sb_xTe_{1-x}$ material, where $0.4 (Sb_2Te_3) <= x <= 0.7 (Sb_7Te_3)$, or $In_2Se_3$. The memory cells may be comprised of vertical access transistors. One embodiment of the method is a self-aligned integration scheme to build a high-density phase-memory cell with an area of 6 square lithographic feature sizes ($6F^2$) utilizing a vertical transistor as the access transistor. A channel for the vertical access transistor may be formed by silicon pillar etching, which is achieved by etching lines first and then etching lines orthogonal to them. The memory cell may be self-aligned to the drain of the access transistor.

The method includes a formation step 602. In the formation step 602, a plurality of dielectric pillars is formed on the substrate. The dielectric pillars may be single crystal silicon pillars. The single-crystal silicon pillars may be for building access transistors for the memory cells. After the formation step 602 is completed, the next step is a deposition step 604.

During the deposition step 604, an electrically conductive gate material is deposited between and over the pillars. The electrically conductive material is deposited to fill up the trenches on the substrate between the pillars. The electrically conductive gate material may be polysilicon. Deposition may be achieved by depositing a uniform layer of poly-silicon over the substrate followed by Chemical Mechanical Polishing. Other conducting gate material may replace the polysilicon material. After the deposition step 604 is completed, the next step is an etching step 606.

During the etching step 606, the gate material is etched such that the gate material partially fills a space between the pair of pillars, the gate material forming a word line for the memory cells. After the etching step 606 is completed, the next step is an etching step 608.

During the etching step 608 a gate contact region for the word line is etched into the substrate between a pair of the dielectric pillars. After the etching step 608 is completed, the next step is a formation step 610.

During the formation step 610, a spacer made of electrically insulating material is formed in the gate contact region. The insulating material may be silicon nitride. The spacer may be formed by depositing the insulating material followed by reactive ion etching. After the formation step 610 is completed, the next step is a deposition step 612.

During the deposition step 612, a gate contact is deposited between the pair of pillars such that the gate contact is in electrical contact with the gate material and the spacer surrounds the gate contact. After the deposition step 612 is completed, the next step is a formation step 614.

During the formation step 614, a bit line is formed with. In one embodiment of the present invention, a bit line pitch at least one lithographic feature size less than the word line pitch of the word line. In another embodiment of the present invention, the word line has a pitch of 3 lithographic feature sizes and the bit line is formed with a pitch of 2 lithographic feature sizes.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method to prevent a gate contact from electrically connecting to a source contact for a plurality of memory cells on a substrate, the method comprising:
   forming dielectric pillars on the substrate;
   depositing an electrically conductive gate material between and over the pillars;
   etching the gate material such that the gate material partially fills a space between the pair of pillars, the gate material forming a word line for the memory cells;
   etching a gate contact region for the word line between a pair of the pillars;
   forming a spacer of electrically insulating material in the gate contact region; and
   depositing a gate contact between the pair of pillars such that the gate contact is in electrical contact with the gate material and the spacer surrounds the gate contact.

2. A method as in claim 1, wherein the memory cells are phase change memory cells.

3. The method as in claim 2, wherein the memory cells include Ge2Sb2Te5.

4. The method as in claim 2, wherein the memory cells include SbTe materials.

5. The method as in claim 2, wherein the memory cells include In2Se3.

6. A method as in claim 1, wherein the insulating material is silicon nitride.

7. A method as in claim 1, wherein the memory cells include vertical access transistors.

8. A method as in claim 1, further comprising forming a bit line with a pitch at least one lithographic feature size less than the word line pitch.

9. A method as in claim 1, further comprising:
   forming a bit line with a pitch of two lithographic feature sizes; and
   forming the word line with a pitch of three lithographic feature sizes.

10. A method as in claim 1, further comprising forming the spacer of insulating material using reactive ion etching.

* * * * *